United States Patent
Wu et al.

(10) Patent No.: US 9,129,906 B2
(45) Date of Patent: Sep. 8, 2015

(54) SELF-ALIGNED DOUBLE SPACER PATTERNING PROCESS

(71) Applicant: Taiwan Semiconductor Manufacturing Company, Ltd., Hsin-Chu (TW)

(72) Inventors: Yung-Hsu Wu, Taipei (TW);
Tsung-Min Huang, Taichung (TW);
Cheng-Hsiung Tsai, Zhunan Township (TW); Chung-Ju Lee, Hsin-Chu (TW);
Tien-I Bao, Dayuan Township (TW);
Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/098,315

(22) Filed: Dec. 5, 2013

(65) Prior Publication Data

US 2015/0162205 A1    Jun. 11, 2015

(51) Int. Cl.
*H01L 21/4763* (2006.01)
*H01L 21/308* (2006.01)
*H01L 21/768* (2006.01)

(52) U.S. Cl.
CPC ........ *H01L 21/3088* (2013.01); *H01L 21/3081* (2013.01); *H01L 21/3086* (2013.01); *H01L 21/76877* (2013.01)

(58) Field of Classification Search
USPC ......... 438/618, 689, 696, 551, 552, 553, 671, 438/717, 736, 725
See application file for complete search history.

(56) References Cited

U.S. PATENT DOCUMENTS

2011/0316165 A1* 12/2011 You et al. ...................... 257/773

* cited by examiner

*Primary Examiner* — Timor Karimy
(74) *Attorney, Agent, or Firm* — Slater & Matsil, L.L.P.

(57) ABSTRACT

Embodiments of the present disclosure are a method of forming a semiconductor device and methods of patterning a semiconductor device. An embodiment is a method of forming a semiconductor device, the method including forming a first hard mask layer over a semiconductor device layer, the first hard mask layer comprising a metal-containing material, forming a second hard mask layer over the first hard mask layer, and forming a first set of metal-containing spacers over the second hard mask layer. The method further includes patterning the second hard mask layer using the first set of metal-containing spacers as a mask, forming a second set of metal-containing spacers on sidewalls of the patterned second hard mask layer, and patterning the first hard mask layer using the second set of metal-containing spacers as a mask.

20 Claims, 14 Drawing Sheets

US 9,129,906 B2

SELF-ALIGNED DOUBLE SPACER PATTERNING PROCESS

BACKGROUND

With the increasing down-scaling of semiconductor devices, various processing techniques, such as, photolithography are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
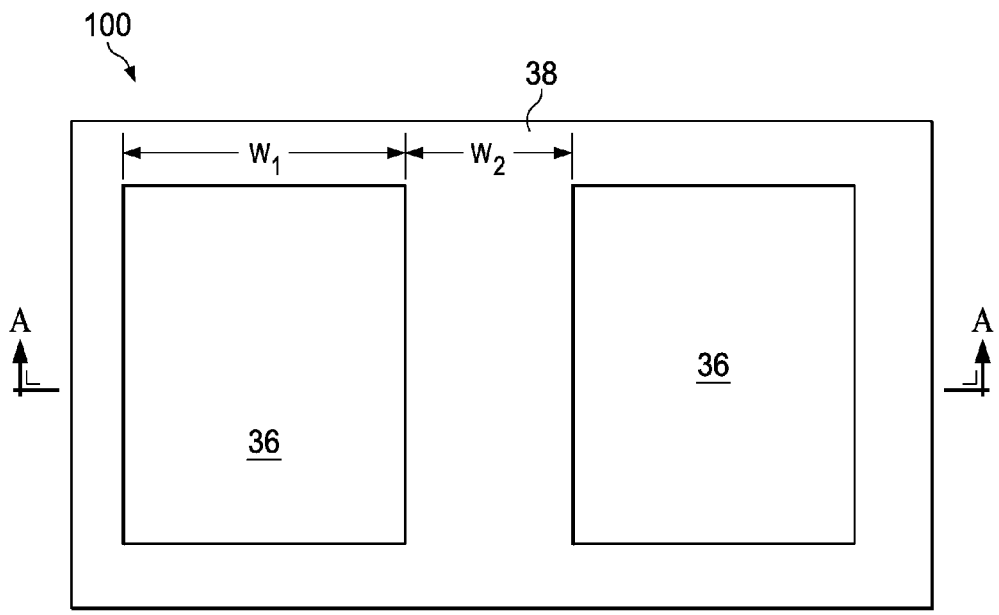
FIGS. 1A, 1B, 2A, 2B, 3A, 3B, 4A, 4B, 5A, 5B, 6A, 6B, 7A, 7B, 8A, 8B, 9, and 10 are top-views and cross-sectional views of intermediate stages in the patterning of a semiconductor device in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a method for patterning a semiconductor device layer by transferring multiple patterns to multiple hard mask layers over the semiconductor device layer. At least one of the patterns includes a sidewall aligned spacer conformally deposited over mandrels; the spacers being formed of a high etch selectivity material such as titanium oxide.

FIGS. 1A through 10 are cross-sectional views of intermediate stages in the patterning of a semiconductor device 100 in accordance with an embodiment. FIGS. 1A and 1B illustrate a top view and a cross-sectional view, respectively, of a semiconductor device 100 at an intermediate stage of processing. FIG. 1B is a cross-sectional view along the line A-A in FIG. 1A. FIGS. 2B through 8B and 11B through 15B are also cross-sectional views along the same line A-A in each of the respective top view (FIGS. 2A through 8A and 11A through 15A), although the line A-A is not shown on these subsequent Figures.

Figure 1B:
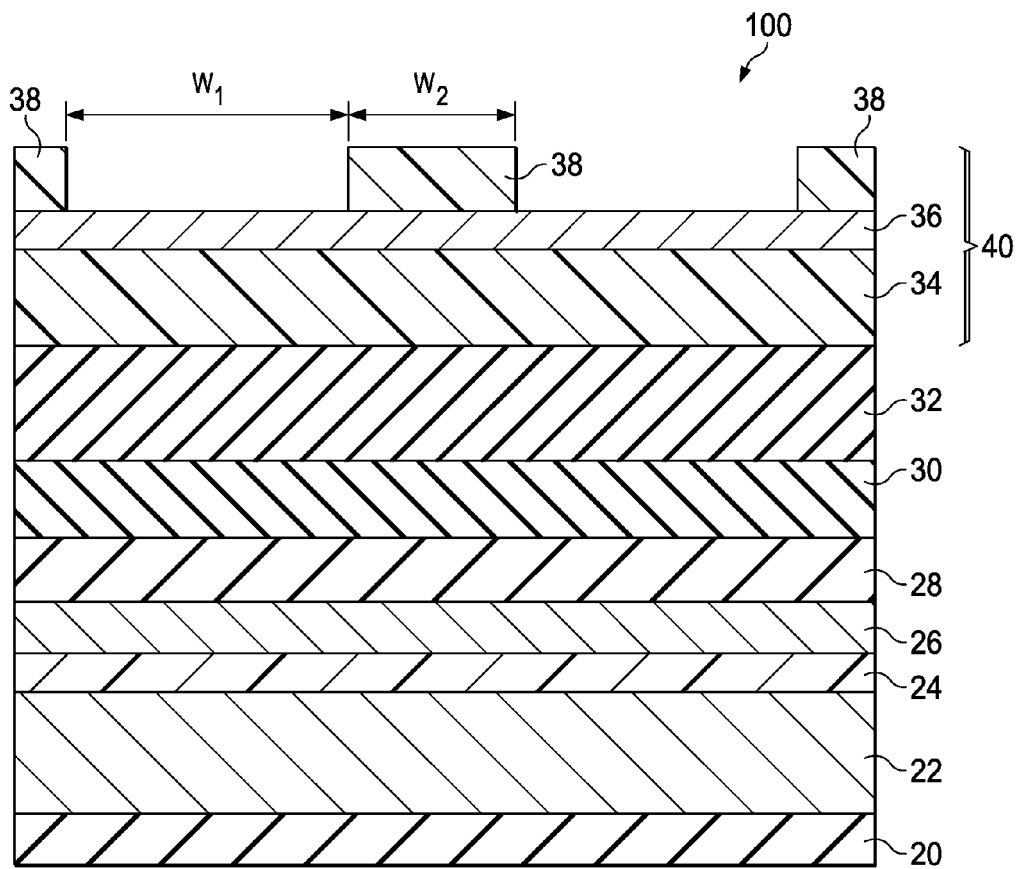

Referring to FIGS. 1A and 1B, the semiconductor device 100 includes an optional etch stop layer (ESL) 20, a semiconductor device layer 22, an anti-reflective coating (ARC) 24, hard mask layers 26, 28, 30, and 32, and a tri-layer photoresist 40 over the hard mask layers 26-32. The semiconductor device layer 22 is a layer that requires patterning. In some embodiments, the semiconductor device layer 22 is a metallic layer to be used for metal lines and is made of copper, aluminum, the like, or a combination thereof. In other embodiments, the semiconductor device layer 22 is a dielectric layer, such as a low-k dielectric layer, a polymer layer, or the like. In yet other embodiments, the semiconductor device layer 22 is a substrate and is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In the embodiments wherein the semiconductor device layer 22 is a substrate, the ESL 20 may be omitted. In the embodiments wherein the semiconductor device layer 22 is not a substrate, a substrate (not shown) may be below the optional ESL 20. The substrate (not shown) may be formed of similar materials as described above, and the description will not be repeated herein.

The substrate (not shown) or in the embodiment wherein the semiconductor device layer 22 is a substrate may include active and passive devices (not shown). As one of ordinary skill in the art will recognize, a wide variety of devices such as transistors, capacitors, resistors, combinations of these, and the like may be used to generate the structural and functional requirements of the design for the semiconductor device 100. The active and passive devices may be formed using any suitable methods.

The ARC 24 may be formed over the semiconductor device layer 22. The ARC 24 prevents radiation in subsequent photolithographic processes from reflecting off layers below and interfering with the exposure process. Such interference can increase the critical dimension of the photolithography process. Sometimes the ARC 24 is referred to as an anti-reflective layer (ARL) 24. In some embodiments, the ARC 24 is a nitrogen-free ARC (NFARC) 24 and is made of a silicon-rich oxide (SRO), silicon oxycarbide, the like, or a combination thereof. In some embodiments, the ARC 24 is formed by chemical vapor deposition (CVD), plasma enhanced CVD (PECVD), the like, or a combination thereof.

The hard mask layers 26, 28, 30, and 32 are formed over the ARC 24. In an embodiment, the hard mask layer 26 is a metal hard mask layer and the hard mask layers 28, 30, and 32 are dielectric hard mask layers. In subsequent processing steps, a pattern is transferred onto the hard mask layer 26 using various photolithography and etching techniques. The hard mask layer 26 may then be used as a patterning mask for etching the underlying ARC 24 and the semiconductor device layer 22. The hard mask layer 26 may be a masking material such as titanium nitride, titanium oxide, the like, or a combination thereof. The hard mask layer 26 may be formed using a process such as CVD, physical vapor deposition (PVD), atomic layer deposition (ALD), the like, or a combination thereof. In an embodiment, the hard mask layer 26 is formed to have a thickness from about 100 Angstroms to about 500 Angstroms.

The hard mask layer 28 may be deposited over the hard mask layer 26. The hard mask layer 28 may be used as a masking pattern for the hard mask layer 26. In subsequent processing steps, the hard mask layer 28 is patterned by multiple patterns (see FIGS. 8A and 8B) which may then be transferred to the hard mask layer 26. The hard mask layer 28 may be a masking material such as tetraethyl orthosilicate (TEOS), $SiO_xC_y$, the like, or a combination thereof. The hard mask layer 28 may be formed using a process such as CVD, ALD, the like, or a combination thereof. In an embodiment, the hard mask layer 28 is formed to have a thickness from about 100 Angstroms to about 1000 Angstroms.

The hard mask layer 30 is formed over the hard mask layer 28. The hard mask layer 30 may be used to form mandrels 30' (see FIG. 5B) and will be referred to as a mandrel layer 30 hereinafter. The mandrel layer 30 may be a masking material such as amorphous silicon, amorphous carbon, a metal film such as $AlO_xN_y$, the like, or a combination thereof or any other material that may be patterned and selectively removed. The mandrel layer 30 may be formed using a process such as CVD, ALD, the like, or a combination thereof. In an embodiment, the hard mask layer 30 is formed to have a thickness from about 200 Angstroms to about 1000 Angstroms.

The hard mask layer 32 is formed over the mandrel layer 30. The hard mask layer 32 may be used to form mandrels 32' (see FIG. 2B) and will be referred to as a mandrel layer 32 hereinafter. The mandrel layer 32 may be a masking material such as a silicon nitride, silicon oxynitride, the like, or a combination thereof or any other material that may be patterned and selectively removed. The mandrel layer 32 may be formed using a process such as CVD, ALD, the like, or a combination thereof. In an embodiment, the hard mask layer 32 is formed to have a thickness from about 200 Angstroms to about 1000 Angstroms.

The tri-layer photoresist 40 is formed over the mandrel layer 32. The tri-layer photoresist 40 includes a top photoresist layer 38, a middle layer 36, and a bottom layer 34. As the limits of photolithography processes are reached by advanced semiconductor manufacturing processes, the need for thinner top photoresist layers has arisen to achieve smaller process windows. However, thin top photoresist layers may not be sufficiently robust to support the etching of target layers (e.g., the mandrel layer 32). The tri-layer photoresist provides a relatively thin top photoresist layer 38. The middle layer 36 may include anti-reflective materials (e.g., a backside anti-reflective coating (BARC) layer) to aid the exposure and focus of the top photoresist layer 38's processing. By having the middle layer 36, the thin top photoresist layer 38 is only used to pattern the middle layer 36. The bottom layer 34 may include a hard mask material such as a nitride (e.g., SiON). The middle layer 36 is used to pattern the bottom layer 34. In some embodiments, the middle layer 36 has a high etch selectivity to the bottom layer 34, and, in some embodiments, the bottom layer 34 is more than ten times thicker than the middle layer 36. Thus, the tri-layer photoresist 40 allows for the robust patterning of underlying layers (e.g., the mandrel layer 32) while still providing a relatively thin top photoresist layer 38.

The top photoresist layer 38 may be patterned using any suitable photolithography technique. For example, a photomask (not shown) may be disposed over the top photoresist layer 38, which may then be exposed to a radiation beam which may be ultraviolet (UV) or an excimer laser such as a 248 nm beam from a Krypton Fluoride (KrF) excimer laser, or a 193 nm beam from an Argon Fluoride (ArF) excimer laser. Exposure of the top photoresist layer 38 may be performed using an immersion lithography system to increase resolution and decrease the minimum achievable pitch. A bake or cure operation may be performed to harden the top photoresist layer 38, and a developer may be used to remove either the exposed or unexposed portions of the top photoresist layer 38 depending on whether a positive or negative resist is used. Thus, a pattern such as the pattern illustrated in FIGS. 1A and 1B is formed in the top photoresist layer 38 including the two openings in the top photoresist layer 38 with each opening having a width $W_1$. The two openings are separated by a width $W_2$. The widths $W_1$, $W_2$, and subsequent widths (see Figure W3) are described in terms of the desired spacing and/or width of pattern to be applied to the semiconductor device layer 22 (see FIGS. 9A and 9B) which will represented by X. In an embodiment, the width $W_1$ is about 5X and the width $W_2$ is about 3X. In an exemplary embodiment, the desired spacing and width value of X is 16 nm. In this example, the resulting pitch would be 32 nm (see FIGS. 8A and 8B), the width $W_1$ (5X) would be about 80 nm, and the width $W_2$ (3X) would be about 48 nm.

Figure 8A:
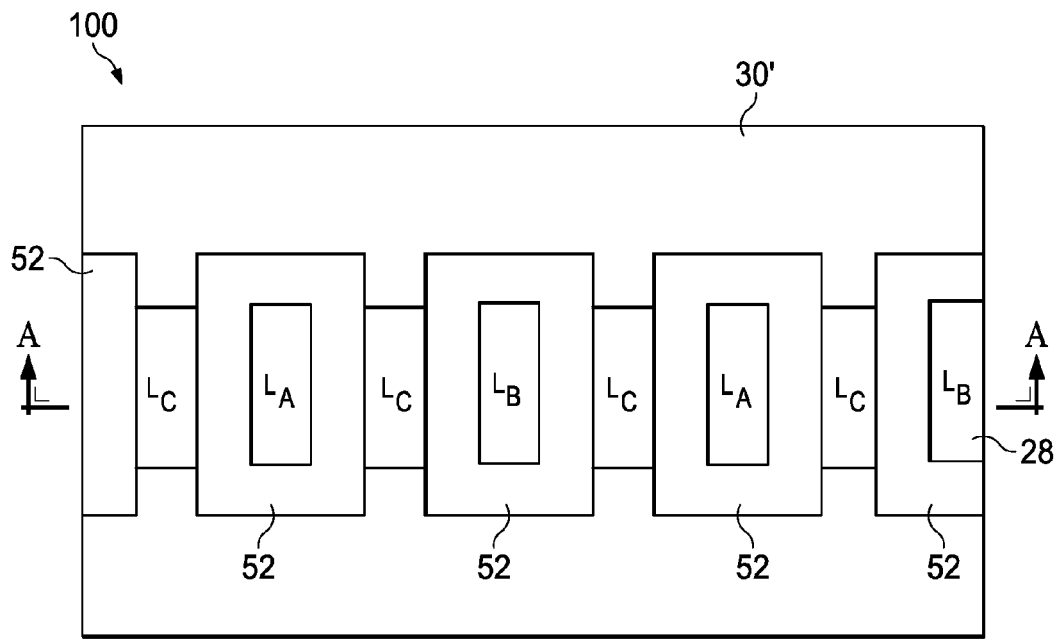
Figure 8B:
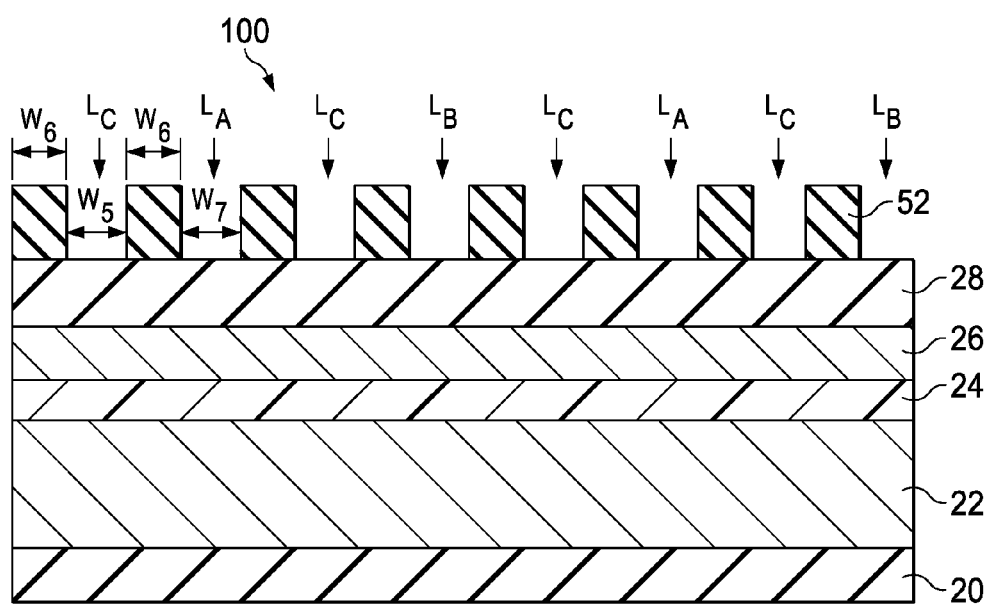

FIGS. 1A and 1B illustrate two openings in the photoresist 38, although there may be more or less openings depending on the number of spacers 52 that are desired (see FIG. 8B). In addition, although the width and spacing in FIGS. 8A and 8B are equal, this disclosure contemplates other embodiments wherein the width and spacing of the spacers 52 are not equal.

Figure 2A:
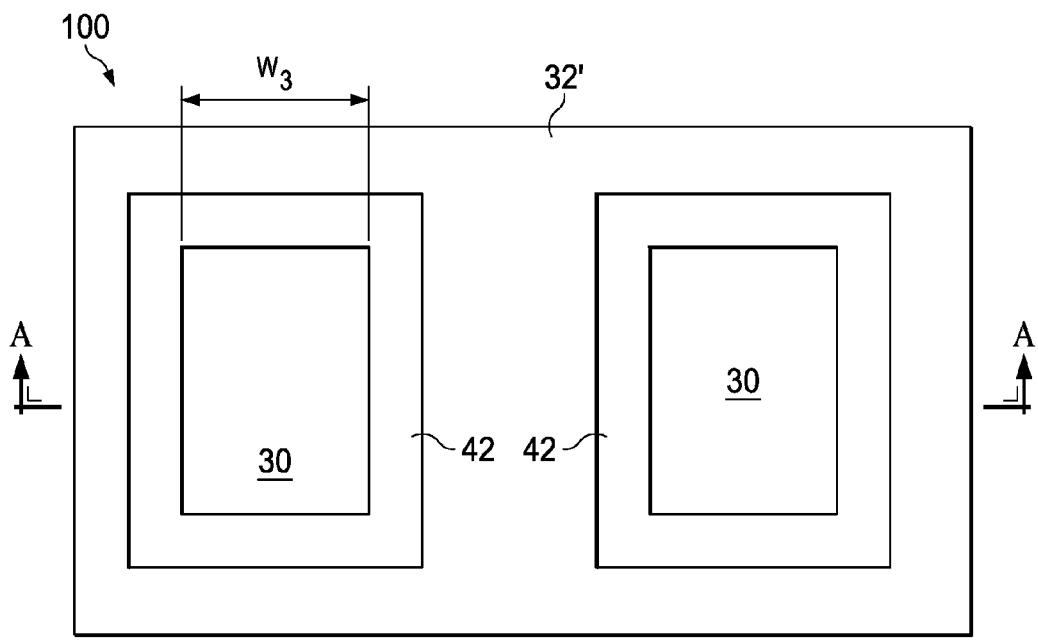
Figure 2B:
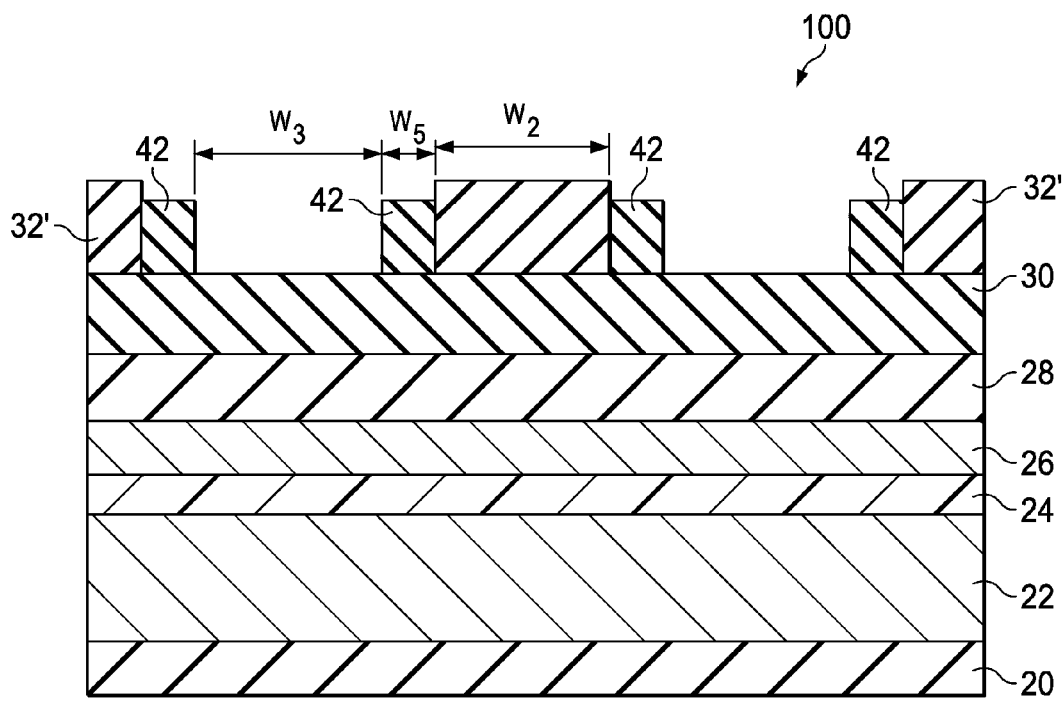

FIGS. 2A and 2B illustrate the resulting structure after the mandrel layer 32 has been patterned forming openings and mandrels 32'. After developing and patterning the top photoresist layer 38, the pattern is transferred to the middle and bottom layers 36 and 34, respectively. The pattern may be transferred, for example, by one or more selective etching processes. After the selective etching processes, the top photoresist layer 38 and the middle layer 36 may be removed by, for example, a trimming process such as an anisotropic plasma etch process. In some embodiments, portions of the bottom layer 34 are also removed during the trimming process to achieve a more stable aspect ratio for subsequent etching steps. In an embodiment, the mandrel layer 32 is etched using the bottom layer 34 as a patterning mask forming the mandrels 32'. In this embodiment, the remaining portions of the bottom layer 34 are removed by, for example, a wet clean process. In another embodiment, the trimming process is omitted, and the mandrel layer 32 is patterned using all three of three layers (38, 36, and 34) of the tri-layer photoresist 40 forming the mandrels 30'. In some embodiments, the mandrel layer 32 is patterned by a dry etch process with etch process gases including $O_2$, $CO_2$, $C_xH_yF_z$, Ar, $N_2$, $H_2$, the like, or a combination thereof. As illustrated in FIGS. 2A and 2B, the mandrels 32' are formed to have the width $W_2$.

After the mandrels 32' are formed, a spacer layer (not shown) is formed over the mandrels 32' and the hard mask layer 30. In an embodiment, the spacer layer is conformally deposited over the mandrels 32' and the hard mask layer 30 such that the thickness of the spacer layer on the top surface of the hard mask layer 30 and the sidewalls of the mandrels 32' is substantially a same thickness. In some embodiments, the spacer layer is a metal-containing spacer layer and is made of, titanium nitride, titanium oxide, the like, or a combination thereof. The material of the spacer layer is selected to have a high etch selectivity to the hard mask layer 30 so that subsequent etching steps may be performed on the spacer layer without attacking the hard mask layer 30. The spacer layer may be deposited through a process such as ALD, CVD, PVD, the like, or a combination thereof, although any acceptable process may be utilized to form the spacer layer to a thickness from about 50 Angstroms to about 250 Angstroms. Further, the thickness of the spacer layer may be selected to determine the thickness of features eventually formed in the semiconductor device layer 22.

After the spacer layer is formed over the mandrels 32', the spacer layer may be etched to expose the mandrels 32' and form spacers 42. The top portions of the spacer layer may be anisotropically etched to expose the underlying mandrels 32' and hard mask layer 30 to form the spacers 42. The spacers 42 are formed along the sidewalls of the mandrels 32' in the openings of the mandrel layer. In an embodiment, the etchant used to etch the top portions of the spacer layer is $Cl_2$, $O_2$, CxHyFz, $N_2$, $H_2$ the like, a combination thereof, or any suitable etchant that can remove the top surfaces of the spacer layer. In an embodiment, the spacers 42 are formed to have a width $W_5$ of about 1X and the width $W_3$ between adjacent spacers 42 is about 3X. In some embodiments, the widths $W_2$ and $W_3$ are substantially equal.

Figure 3A:
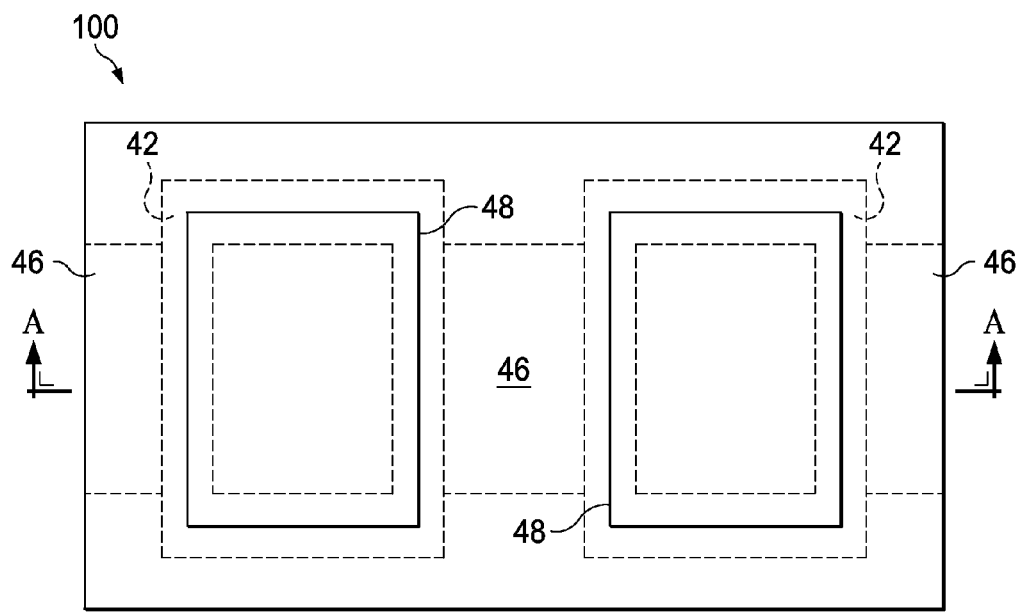
Figure 3B:
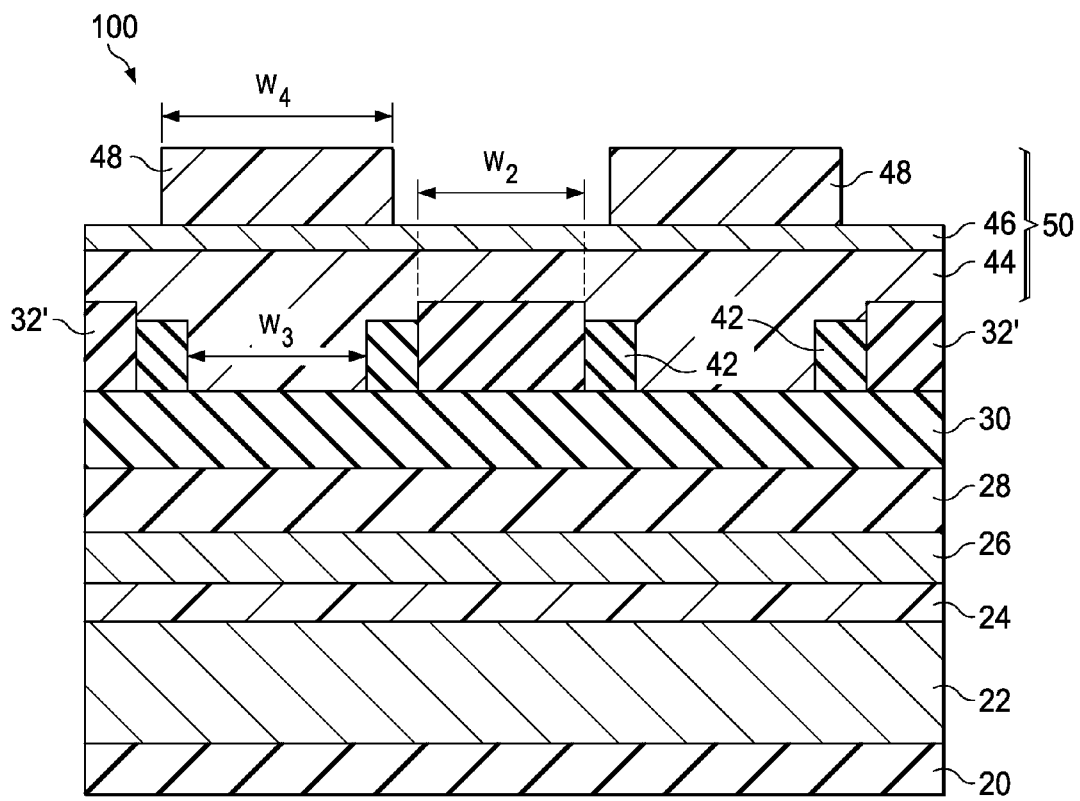

After the spacers 42 are formed, a tri-layer photoresist 50 is formed over the spacers 42 and the mandrels 32' as illustrated in FIGS. 3A and 3B. The tri-layer photoresist 50 may be substantially similar to tri-layer photoresist 40 and includes a relatively thin top photoresist layer 48, a middle layer 46 (e.g., a BARC), and a bottom layer 44 (e.g., a hard mask material).

The top photoresist layer 48 may be patterned, for example, by using an immersion photolithography system including a radiation beam which may be a 248 nm beam from a KrF excimer laser or a 193 nm beam from an ArF excimer laser to expose portions of top photoresist layer 48 and develop the exposed/unexposed portions depending on whether a positive/negative photoresist is used. Thus, a pattern such as the pattern illustrated in FIGS. 3A and 3B is formed in the top photoresist layer 48 including the three openings in the top photoresist layer 48 with the openings being separated by a portion of top photoresist layer 48 having a width $W_4$. In an embodiment, the width $W_4$ is from about 3X to about 5X, such as about 4X. The pattern of the top photoresist layer 48 will be used to mask the portions of the hard mask layer 30 exposed between spacers 42 so that the mandrels 32' may be removed by a subsequent etching process. Thus, the width $W_4$ should be greater than or equal to the width W3 of the exposed portion of the hard mask layer 30 and the width $W_4$ should be less than the width W3 plus the widths of the spacers 42 surrounding the exposed portion of the hard mask layer 30. In some embodiments, the openings formed in the top photoresist layer 48 also have a width $W_4$. The pattern shown in FIGS. 3A and 3B is for illustrative purposes only and different patterns may be formed depending on the design of semiconductor device 100.

Figure 4A:
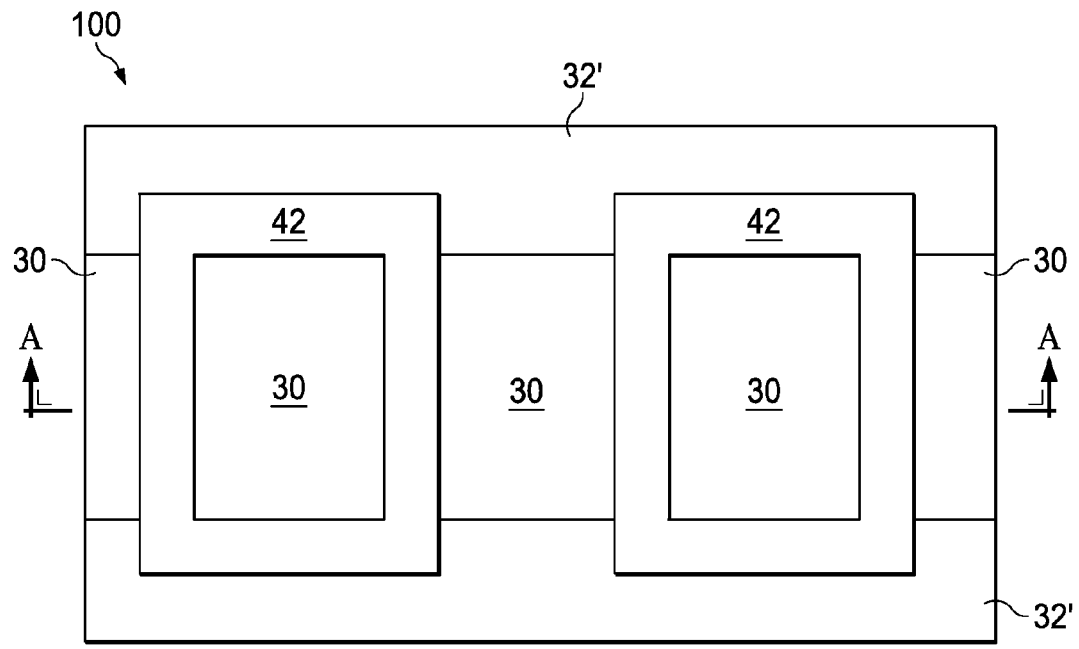
Figure 4B:
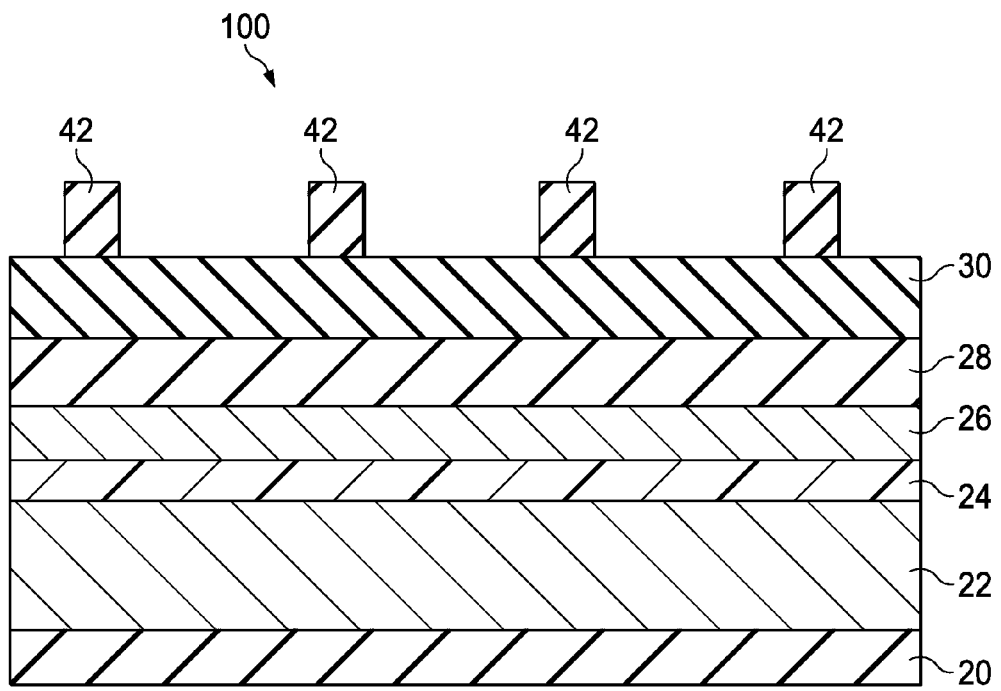

FIGS. 4A and 4B illustrate the removal of the mandrels 32' exposed in the openings of the top photoresist layer 48 (see FIGS. 3A and 3B). The middle layer 46 and the bottom layer 44 of the tri-layer photoresist 50 are patterned by the top photoresist layer 48 such that top surfaces of the mandrels 32' are exposed. In an embodiment, the exposed mandrels 32' are patterned by a dry etch process with etch process gases including $O_2$, $CO_2$, CxHyFz, Ar, $N_2$, $H_2$, the like, a combination thereof, or any other suitable etchant that can remove the mandrels 32' without damaging the spacers 42. As illustrated in FIGS. 4A and 4B, the mandrels 32' may only be removed in a central portion of the semiconductor device 100 as the mandrels 32' may remain on edge portions of the semiconductor device 100. In some embodiments, all of the mandrels 32' are removed.

Figure 5A:
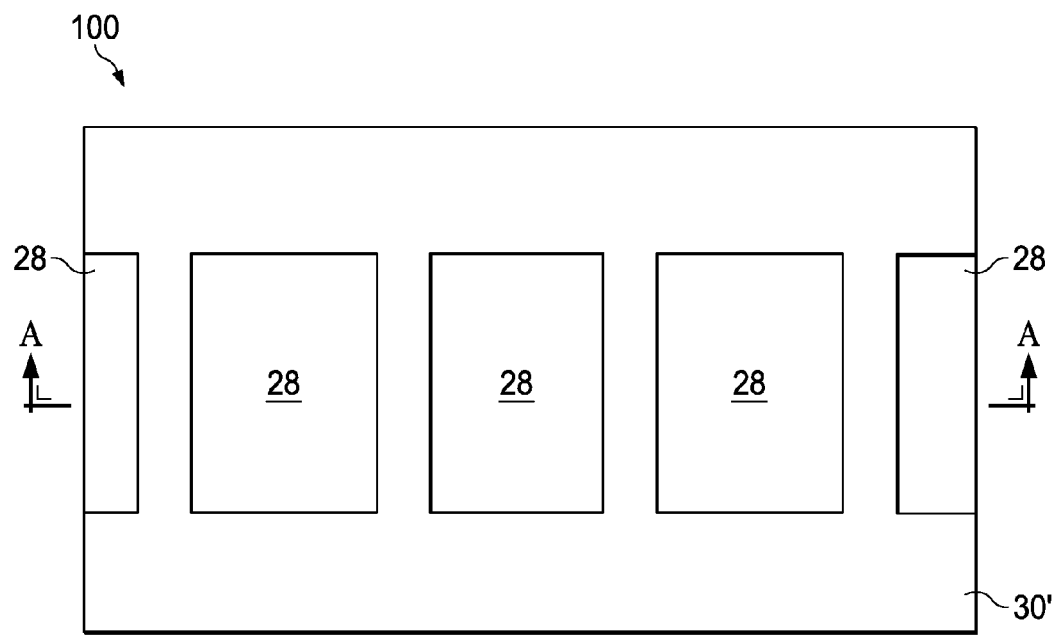
Figure 5B:
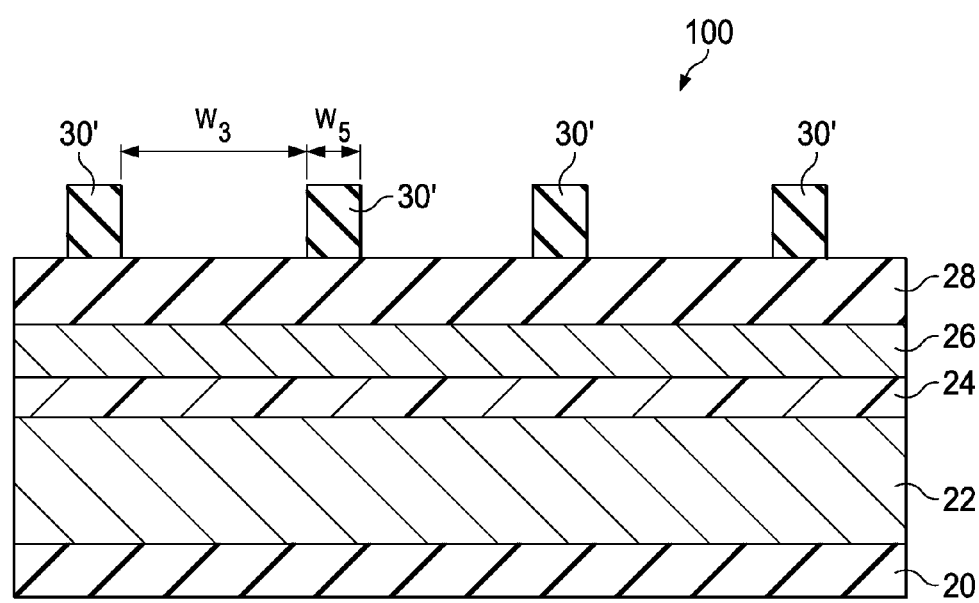

FIGS. 5A and 5B illustrate patterning the hard mask layer 30 with the spacers 42 to form mandrels 30'. In some embodiments, the mandrel layer 30 is patterned by a dry etch process with etch process gases including $O_2$, $CO_2$, CxHyFz, Ar, $N_2$, $H_2$, the like, or a combination thereof. As illustrated in FIGS. 5A and 5B, the mandrels 30' are formed to have the width $W_5$ and adjacent mandrels 30' are separated by the width $W_3$.

Figure 6A:
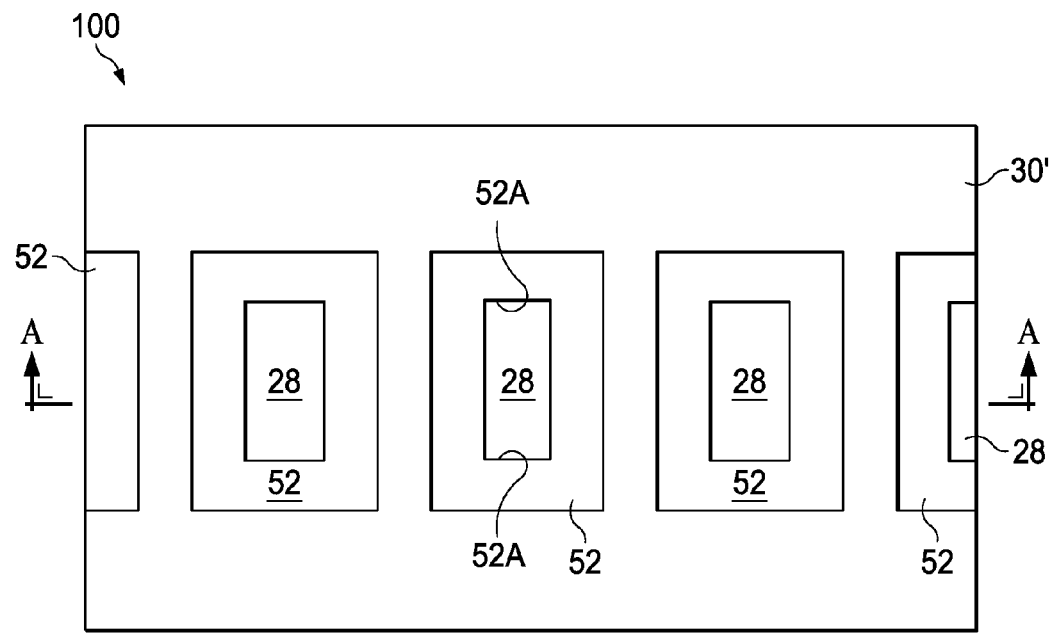
Figure 6B:
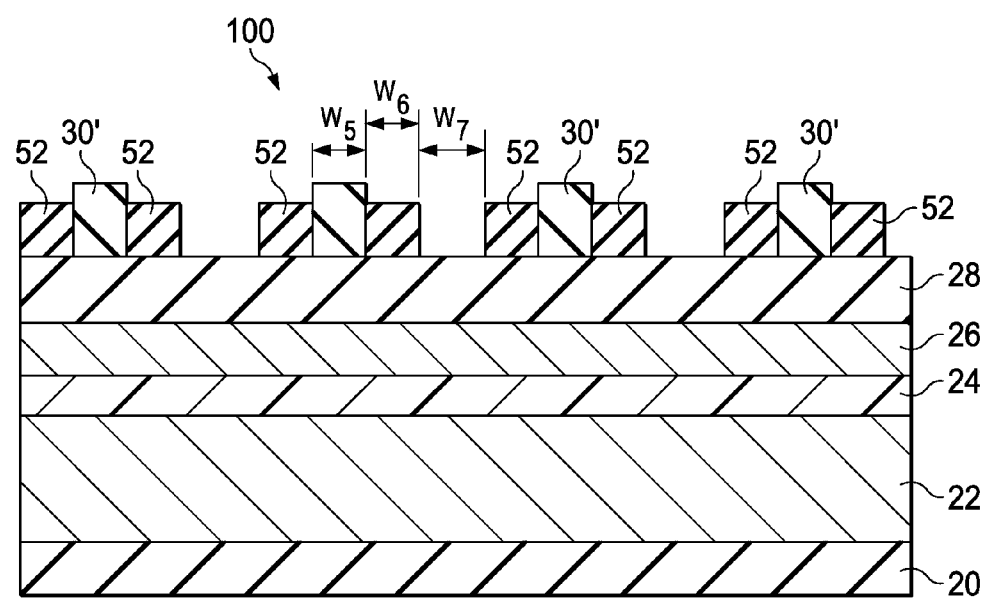

FIGS. 6A and 6B illustrate the formation of spacers 52 along the sidewalls of the mandrels 30'. After the mandrels 30' are formed, a spacer layer (not shown) is formed over the mandrels 30' and the hard mask layer 28. The spacer layer is similar to the spacer layer described above and the description is not repeated herein, although the spacer layers need not be the same. The thickness of the spacer layer may be selected to determine the thickness of features eventually formed in the semiconductor device layer 22.

After the spacer layer is formed over the mandrels 30', the spacer layer may be etched to expose the mandrels 30' and form spacers 52. The spacer layer may be etched by a similar process to the spacer layer etch described above and the description is not repeated herein, although the spacer layer etch processes need not be the same. In an embodiment, the spacers 52 are formed to have a width $W_6$. In an embodiment, the width $W_6$ is about 1X and the width $W_7$ between adjacent spacers 52 is about 1X. In some embodiments, the widths $W_5$, $W_6$, and $W_7$ are substantially equal.

By forming a second set of spacers 52 on the sidewalls of the pattern of the first set of spacers 42 (used to form mandrels 30'), quadruple patterning is achieved to reduce the pitch while using more proven lithography technology. For example, the current process can use 128 nm pitch lithography and two 16 nm thick spacer layers to achieve a 32 nm pitch interconnect. Thus, the current process can utilize 193 nm immersion lithography to achieve 32 nm pitch while also having a lower cost and higher throughput than the newer lithography methods such as extreme ultraviolet (EUV) lithography or the like.

Figure 7A:
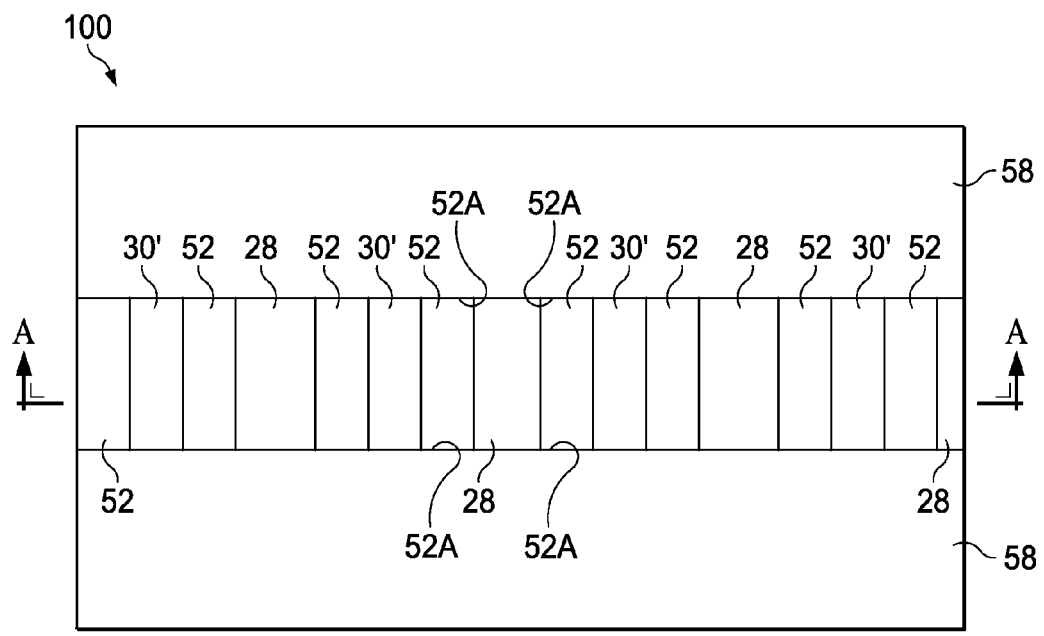
Figure 7B:
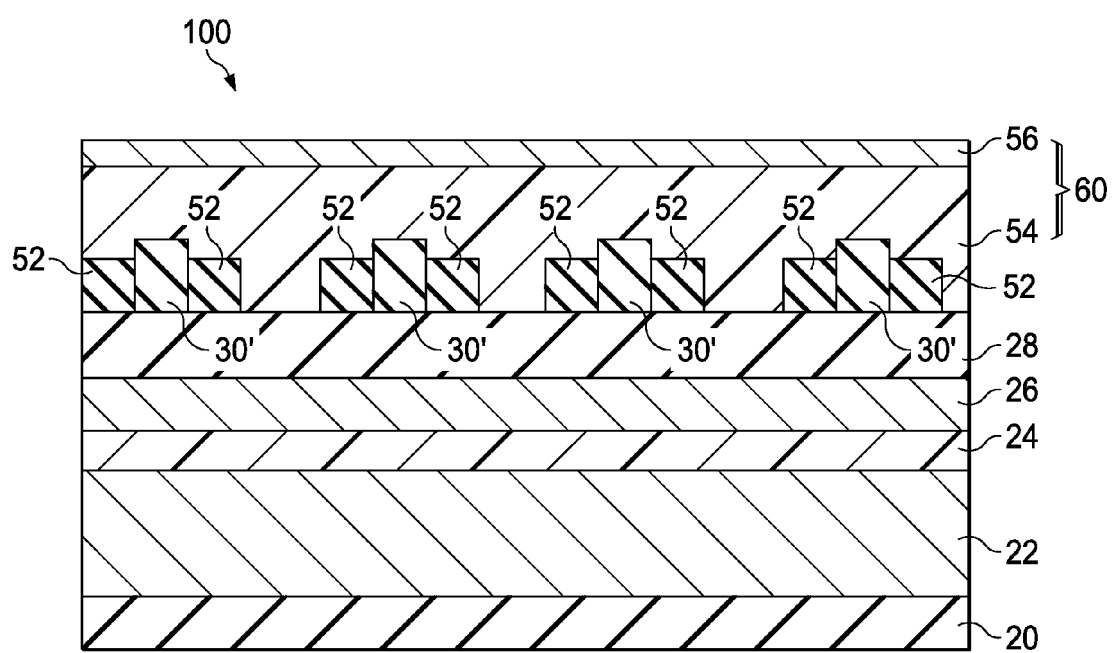

FIGS. 7A and 7B illustrate the formation of a tri-layer photoresist 60 over the spacers 52 and the mandrels 30'. The tri-layer photoresist 60 may be substantially similar to tri-layer photoresist 40 and includes a relatively thin top photoresist layer 58, a middle layer 56 (e.g., a BARC), and a bottom layer 54 (e.g., a hard mask material).

The top photoresist layer 58 may be patterned, for example, by using an immersion photolithography system including a radiation beam which may be a 248 nm beam from a KrF excimer laser or a 193 nm beam from an ArF excimer laser to expose portions of top photoresist layer 58 and develop the exposed/unexposed portions depending on whether a positive/negative photoresist is used. Thus, a pattern such as the pattern illustrated in FIGS. 7A and 7B is formed in the top photoresist layer 58 including an opening in the central portion of the top photoresist layer 58. In an embodiment, the sidewalls of the opening in the top photoresist layer 58 are substantially aligned with sidewalls 52A of the spacers 52 (see FIGS. 6A and 7A). The pattern of the top photoresist layer 58 will be used to mask portions of mandrels 30' so other portions of the mandrels 30' may be removed by a subsequent etching process. The pattern shown in FIGS. 7A and 7B is for illustrative purposes only and different patterns may be formed depending on the design of semiconductor device 100.

FIGS. 8A and 8B illustrate the removal of the portions of the mandrels 30' exposed in the opening of the top photoresist layer 58 (see FIGS. 7A and 7B). The middle layer 56 and the bottom layer 54 of the tri-layer photoresist 60 are patterned by the top photoresist layer 58 such that portions of the top surfaces of the mandrels 30' are exposed. In an embodiment, the exposed mandrels 30' are patterned by a dry etch process with etch process gases including $O_2$, $CO_2$, CxHyFz, Ar, $N_2$, $H_2$, the like, a combination thereof, or any other suitable etchant that can remove the mandrels 30' without damaging the spacers 52 and the hard mask layer 28. As illustrated in FIGS. 7A and 7B, the mandrels 30' may only be removed in a central portion of the semiconductor device 100 as the mandrels 30' may remain on edge portions of the semiconductor device 100.

After portions of the mandrels 30' are removed, the spacers 52 remain on a surface of the hard mask layer 28. The spacers 52 each have a width of $W_6$ and they are spaced apart by widths $W_5$ or $W_7$. In an embodiment, the widths $W_5$, $W_6$, and $W_7$ are substantially equal. In an exemplary embodiment, the widths $W_5$, $W_6$, and $W_7$ are all about 16 nm and thus the pitch of the spacers 52 is 32 nm.

As illustrated in FIGS. 8A and 8B, the pattern defined by the spacers 52 and remaining portions of mandrels 30' is a combination of several lithography processes. The line pattern A ($L_A$) results from lithography steps including the tri-layer photoresist 40 and spacers 42 as illustrated in FIGS. 1A through 2B. The line pattern B ($L_B$) results from lithography steps including the tri-layer photoresist 50 and spacers 52 as illustrated in FIGS. 3A through 4B. The line pattern C ($L_c$) results from lithography steps including the tri-layer photoresist 60 and spacers 52 as illustrated in FIGS. 7A through 8B.

Figure 9:
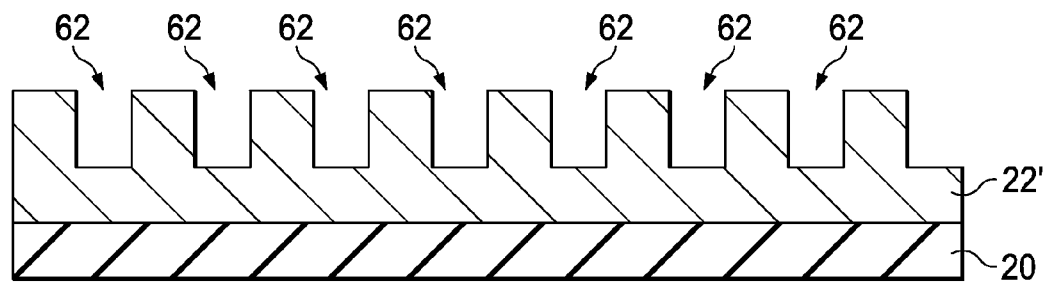

As illustrated in FIG. 9, the spacers 52 may be used to pattern the hard mask layer 28, the hard mask layer 26, the ARC layer 24, and the semiconductor device layer 22. In an embodiment, the hard mask layer 28 is patterned by a dry etch process with etch process gases including $O_2$, $CO_2$, CxHyFz, Ar, $N_2$, $H_2$, the like, a combination thereof, or any other suitable etchant that can pattern the hard mask layer 28. The patterned hard mask layer 28 is then used as a mask to pattern the hard mask layer 26. In an embodiment, the hard mask layer 26 is patterned using an etch process including etchant gases comprising $Cl_2$, $O_2$, CxHyFz, $N_2$, $H_2$, the like, or a combination thereof.

The ARC 24 may be patterned using the patterned hard mask layer 28 as a mask. The ARC 24 may be patterned by an etch process including etchants such as $C_4F_8$, $N_2$, $O_2$, Ar, the like, or a combination thereof. The patterned hard mask layer 28 may be used to transfer the illustrated pattern to the semiconductor device layer 22, for example, through an etching process to form a patterned semiconductor device layer 22'. In an embodiment, an upper portion of the he patterned semiconductor device layer 22' has a plurality of trenches 62 formed therein. The spacers 52, the hard mask layer 26, and the ARC layer 24 may then be removed as shown in FIG. 9. The plurality of trenches 62 may be filled with a conductive material to form a plurality of conductive lines (see FIG. 10).

Figure 10:
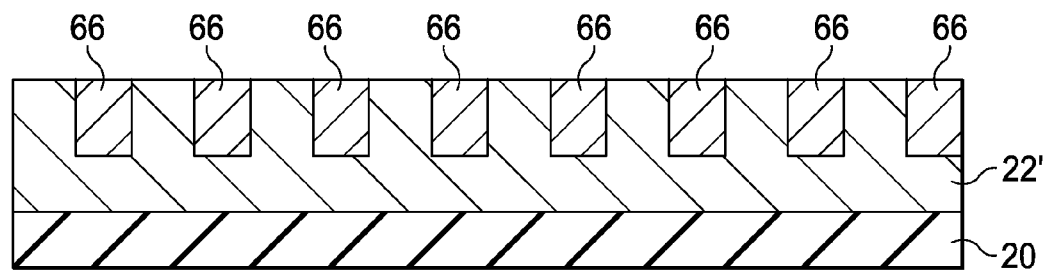

FIG. 10 illustrates forming a conductive material 66 over the patterned semiconductor device layer 22', filling the plurality of trenches 62. The conductive material 66 may include a barrier layer, a seed layer, a liner, or multiple layers or combinations thereof, for example, not shown. A fill material such as copper, a copper alloy, aluminum, an aluminum alloy, the like, or a combination thereof may be formed over the layers/liner using an electro-chemical plating (ECP) method and/or other deposition method. A chemical-mechanical polish (CMP) process and/or etch process may be used to remove excess conductive material 66 from over the top surface of the patterned semiconductor device layer 22', as shown in FIG. 10, forming a plurality of conductive lines 66 in the patterned semiconductor device layer 22'. The conductive lines 66 have substantially the same pitch and spacing as the spacers 52 shown in FIGS. 8A and 8B.

The materials for the various layers may be selected to ensure sufficient etch selectivity between the layers. In an exemplary embodiment, the hard mask layer 26 is titanium nitride, the hard mask layer 28 is TEOS, the mandrel layer 30 is amorphous silicon, the mandrel layer 32 is silicon nitride, and the spacers 42 and 52 are both titanium oxide. In another exemplary embodiment, the hard mask layer 26 is titanium oxide, the hard mask layer 28 is $SiO_xC_y$, the mandrel layer 30 is $AlO_xN_y$, the mandrel layer 32 is SiON, and the spacers 42 and 52 are both titanium nitride. These embodiments are only examples of possible combinations of the materials that may be used and the present disclosure is not intended to be limited to these particular embodiments.

By forming two sets of spacers with substantially the same widths (spacers 42 and 52), quadruple patterning is achieved to reduce the pitch which allows the use of more proven lithography technology. For example, the current process can use 128 nm pitch lithography and two 16 nm thick spacer layers to achieve a 32 nm pitch interconnect. Thus, the current process can utilize 193 nm immersion lithography to achieve 32 nm pitch while also having a lower cost and higher throughput than the newer lithography methods such as extreme ultraviolet (EUV) lithography or the like.

FIGS. 11A through 15B are cross-sectional views of intermediate stages in the patterning of a semiconductor device 200 in accordance with another embodiment. The patterning of the semiconductor device 200 is similar to the patterning of the semiconductor device 100 except that the semiconductor device 200 includes another hard mask layer 31 between the mandrel layers 30 and 32. The additional hard mask layer 31 allows additional material schemes for hard mask layers and the mandrel layers. Details regarding this embodiment that are similar to those for the previously described embodiment are not repeated herein.

Figure 11A:
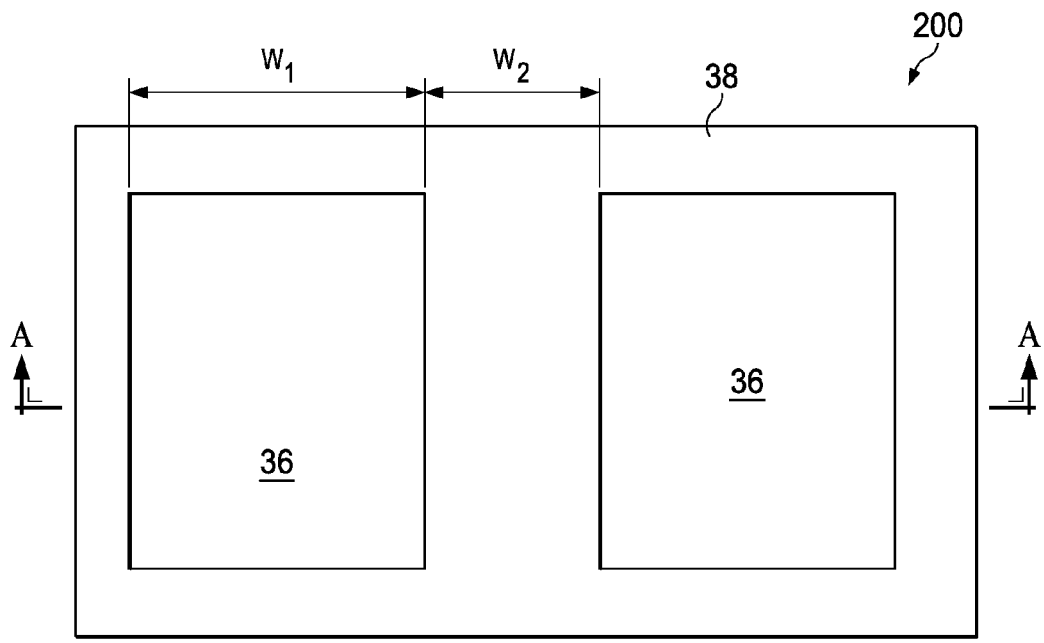
FIGS. 11A, 11B, 12A, 12B, 13A, 13B, 14A, 14B, 15A, and 15B are top-views and cross-sectional views of intermediate stages in the patterning of a semiconductor device in accordance with another embodiment.
Figure 11B:
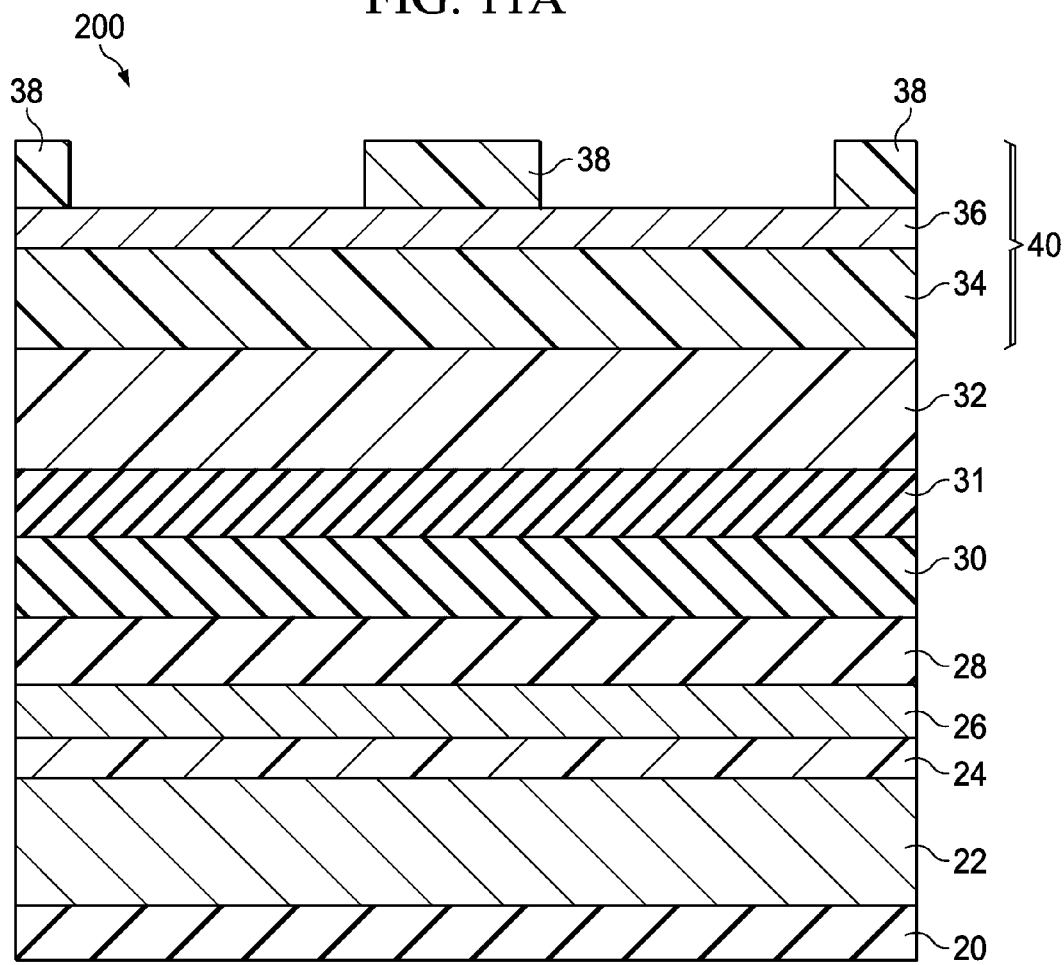

Referring to FIGS. 11A and 11B, the hard mask layers 26, 28, and 31 and mandrel layers 30 and 32 are formed over the ARC 24. In an embodiment, the hard mask layer 26 is a metal hard mask layer and the hard mask layers 28, 30, 31, and 32 are dielectric hard mask layers. In subsequent processing steps, a pattern is transferred onto the hard mask layer 26 using various photolithography and etching techniques. The hard mask layer 26 may then be used as a patterning mask for etching the underlying ARC 24 and the semiconductor device layer 22. The hard mask layer 26 may be a masking material such as titanium nitride, titanium oxide, the like, or a combination thereof. The hard mask layer 26 may be formed using a process such as CVD, PVD, ALD, the like, or a combination thereof. In an embodiment, the hard mask layer 26 is formed to have a thickness from about 100 Angstroms to about 500 Angstroms.

The hard mask layer 28 may be deposited over the hard mask layer 26. The hard mask layer 28 may be used as a masking pattern for the hard mask layer 26. In subsequent processing steps, the hard mask layer 28 is patterned by multiple patterns, which may then be transferred to the hard mask layer 26. The hard mask layer 28 may be a masking material such as TEOS, $SiO_xC_y$, the like, or a combination thereof. The hard mask layer 28 may be formed using a process such as CVD, ALD, the like, or a combination thereof. In an embodiment, the hard mask layer 28 is formed to have a thickness from about 100 Angstroms to about 1000 Angstroms.

The mandrel layer 30 is formed over the hard mask layer 28. The mandrel layer 30 may be a masking material such as amorphous silicon, a metal film such as $AlO_xN_y$, the like, or a combination thereof or any other material that may be patterned and selectively removed. The mandrel layer 30 may be formed using a process such as CVD, ALD, the like, or a combination thereof. In an embodiment, the hard mask layer 30 is formed to have a thickness from about 200 Angstroms to about 1000 Angstroms.

The hard mask layer 31 is formed over the mandrel layer 30. The hard mask layer 31 may be formed by similar processes and materials as the hard mask layer 28 described above and description is not repeated herein, although the hard mask layers 28 and 31 need not be the same.

The mandrel layer 32 is formed over the hard mask layer 31. The mandrel layer 32 may be formed by similar processes, materials as the mandrel layer 30 described above, and description is not repeated herein, although the mandrel layers 30 and 32 need not be the same.

Figure 12A:
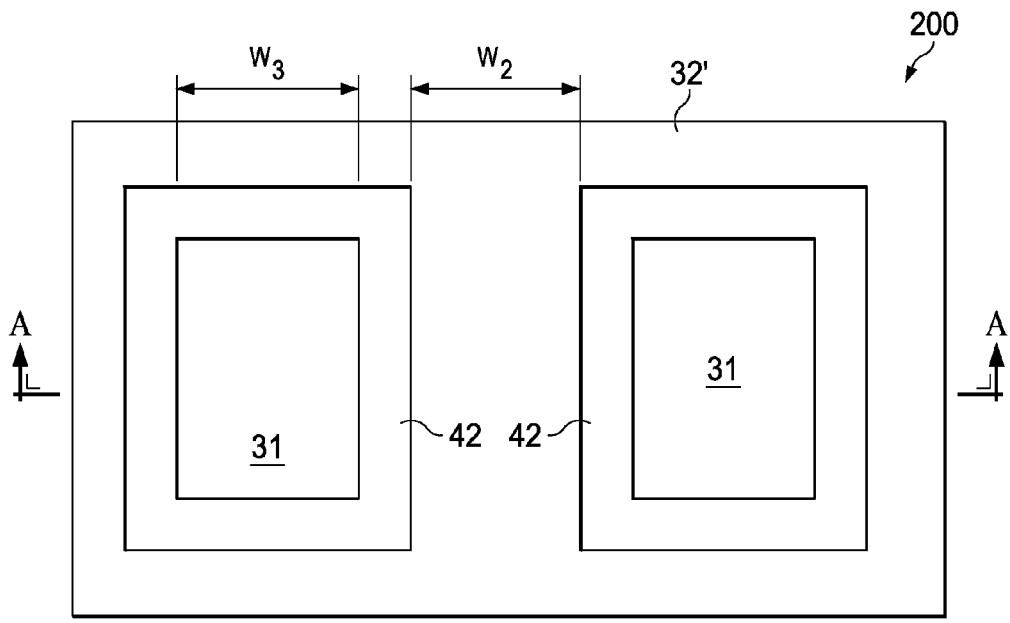
Figure 12B:
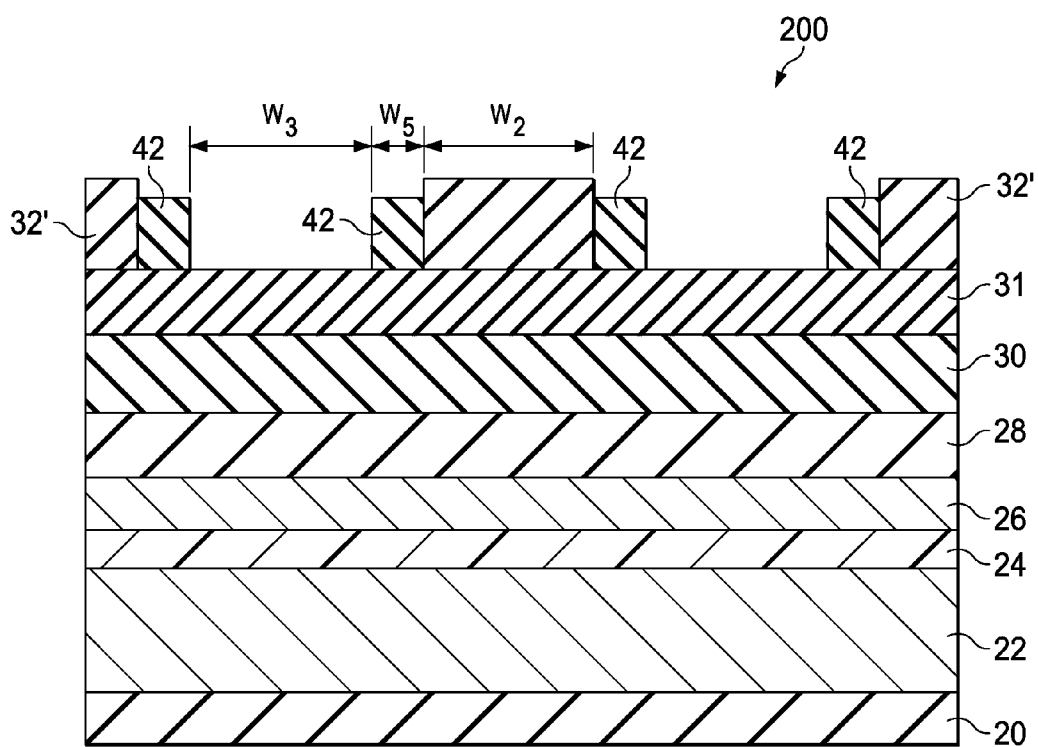

FIGS. 12A and 12B illustrate the resulting structure after the mandrel layer 32 has been patterned forming openings and mandrels 32' on a surface of the hard mask layer 31. The process of forming FIGS. 12A and 12B is similar to the process described above in FIGS. 2A and 2B and the description is not repeated herein.

Figure 13A:
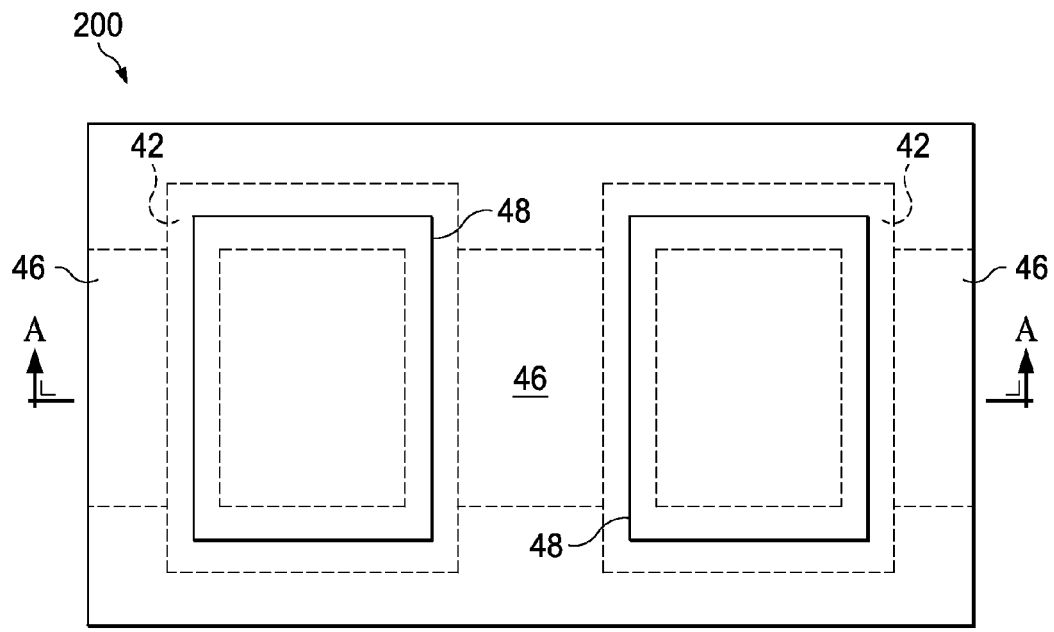
Figure 13B:
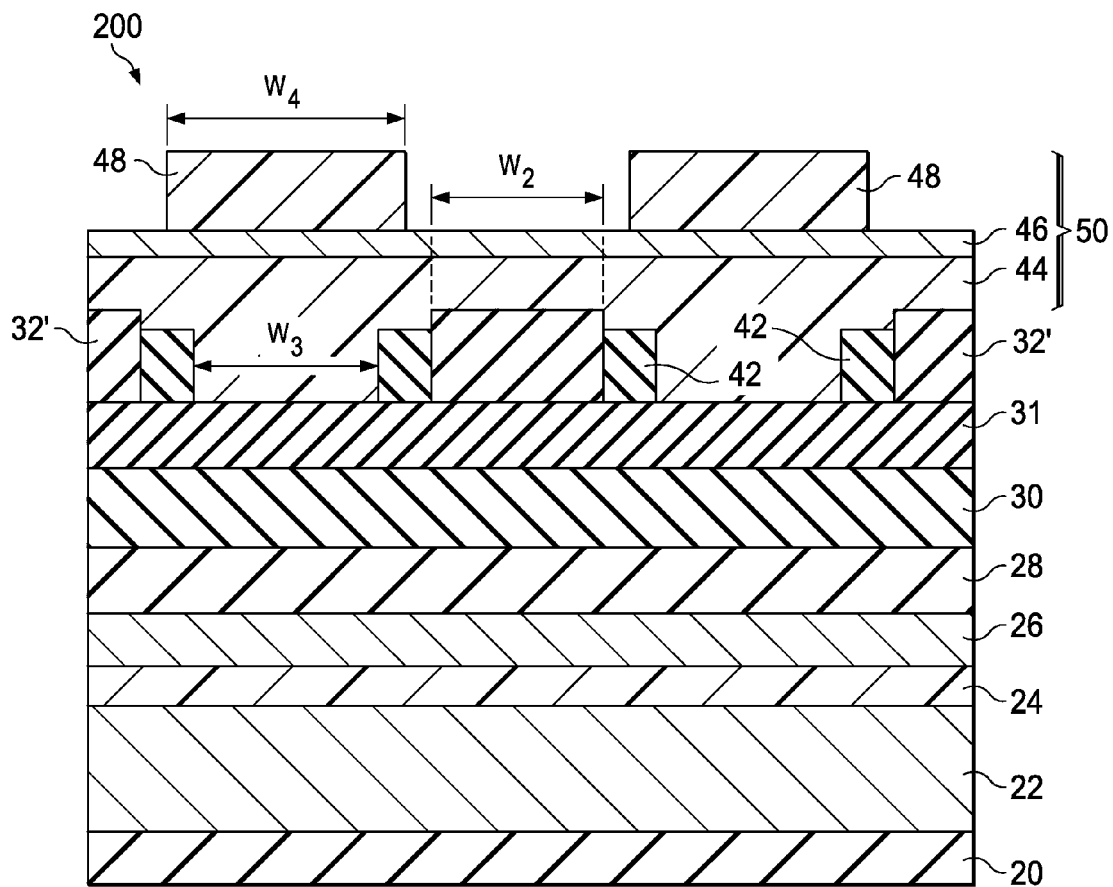

FIGS. 13A and 13B illustrate the formation of the tri-layer photoresist 50 over the mandrels 32' and the hard mask layer 31. The process of forming FIGS. 13A and 13B is similar to the process described above in FIGS. 3A and 3B and the description is not repeated herein.

Figure 14A:
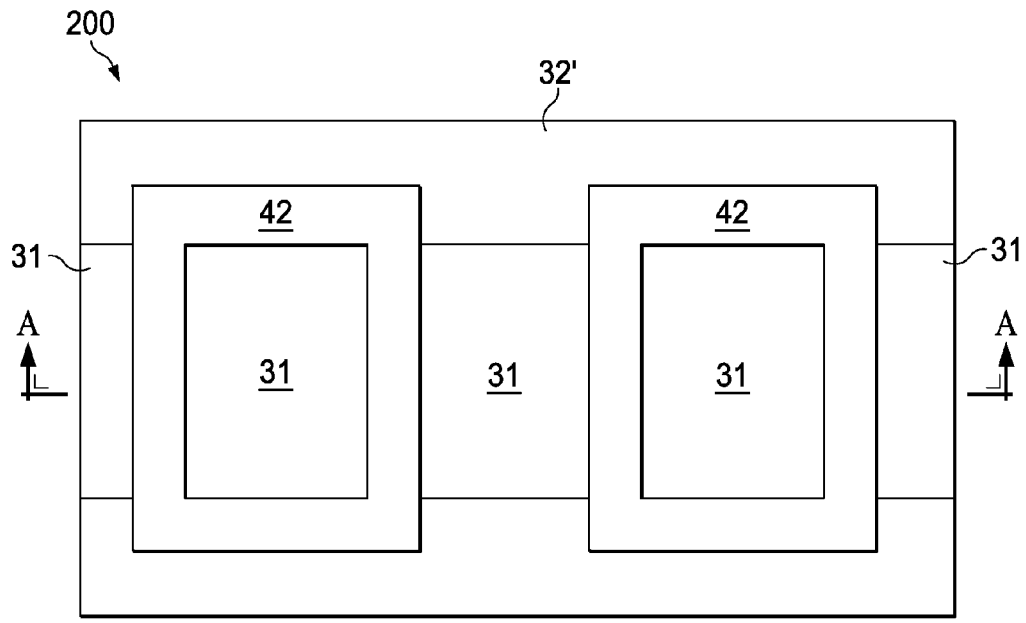
Figure 14B:
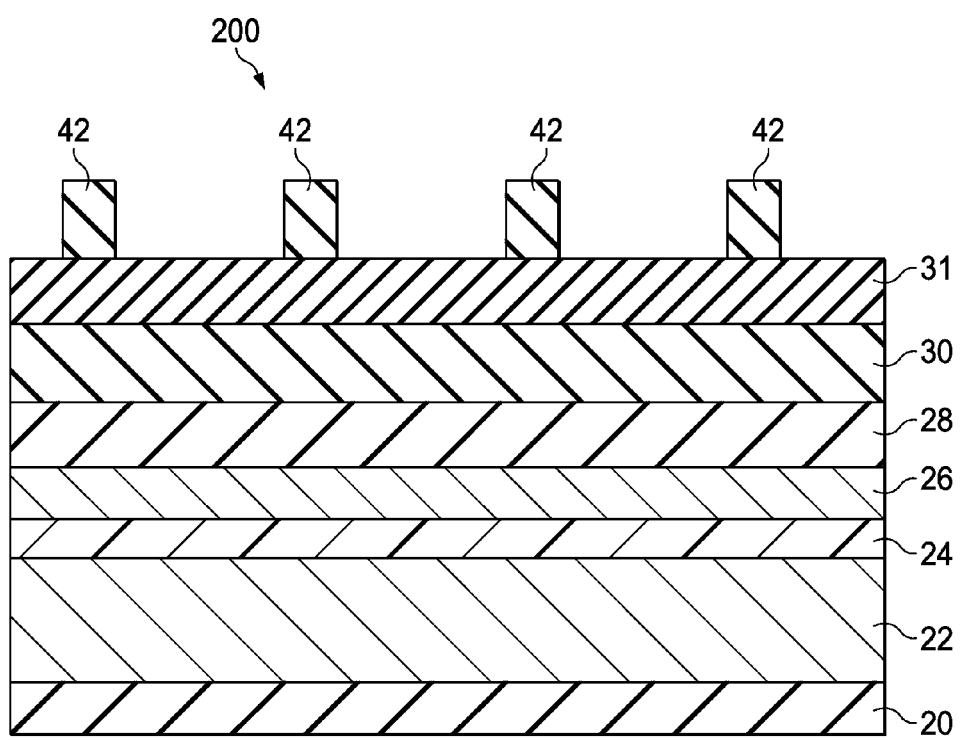

FIGS. 14A and 14B illustrate the removal of the mandrels 32' exposed in the openings of the top photoresist layer 48 (see FIGS. 13A and 13B). The process of forming FIGS. 14A and 14B is similar to the process described above in FIGS. 4A and 4B and the description is not repeated herein.

Figure 15A:
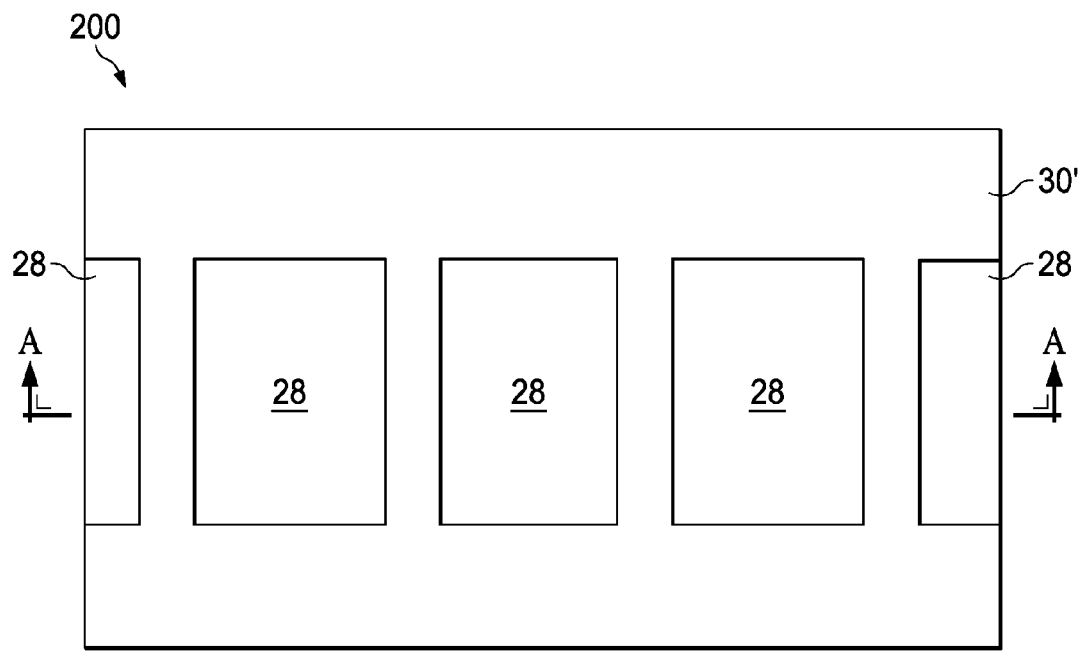
Figure 15B:
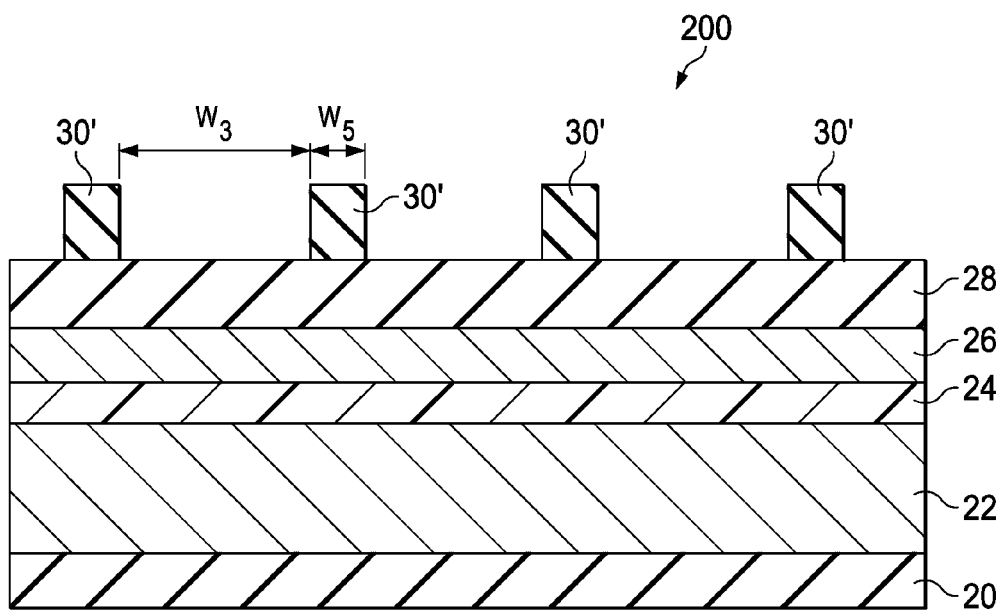

FIGS. 15A and 15B illustrate patterning the hard mask layer 31 and the mandrel layer 30 with the spacers 42 to form mandrels 30'. The spacers 42 are used as a mask to pattern the hard mask layer 31, which is used as a mask to pattern the mandrel layer 30. In an embodiment, the hard mask layer 31 is patterned by a dry etch process with etch process gases including $O_2$, $CO_2$, $C_xH_yF_z$, Ar, $N_2$, $H_2$, the like, a combination thereof, or any other suitable etchant that can pattern the hard mask layer 31. The rest of the processing steps to form the structure in FIGS. 15A and 15B are similar to the process described above in FIGS. 5A and 5B and the description is not repeated herein.

The intermediate structure of the semiconductor device 200 illustrated in FIGS. 15A and 15B will undergo further processing similar to the processing steps illustrated in FIGS. 6A through 10 described above and the description of these process steps are not repeated herein.

An embodiment is a method of forming a semiconductor device, the method including forming a first hard mask layer over a semiconductor device layer, the first hard mask layer comprising a metal-containing material, forming a second hard mask layer over the first hard mask layer, and forming a first set of metal-containing spacers over the second hard mask layer. The method further includes patterning the second hard mask layer using the first set of metal-containing spacers as a mask, forming a second set of metal-containing spacers on sidewalls of the patterned second hard mask layer, and patterning the first hard mask layer using the second set of metal-containing spacers as a mask.

Another embodiment is a method of patterning a semiconductor device, the method including forming a first hard mask layer over a semiconductor device layer, forming a second hard mask layer over the first hard mask layer, forming a third hard mask layer over the second hard mask layer, and forming a fourth hard mask layer over the third hard mask layer. The method further includes patterning the fourth hard mask layer to form a plurality of fourth hard mask portions, the plurality of fourth hard mask portions having a first pitch, forming a first plurality of metal-containing spacers on sidewalls of the plurality of fourth hard mask portions, the first plurality of metal-containing spacers having a second pitch, the second pitch being less than the first pitch, removing the fourth hard mask portions, and patterning the third hard mask layer to form a plurality of third hard mask portions using the first plurality of metal-containing spacers as a mask, the plurality of third hard mask portions having the second pitch. The method further includes forming a second plurality of metal-containing spacers on sidewalls of the plurality of third hard mask portions, the second plurality of metal-containing spacers having a third pitch, the third pitch being less than the second pitch, removing the third hard mask portions, and patterning the second hard mask, the first hard mask, and the semiconductor device layer using the second plurality of metal-containing spacers as a mask.

A further embodiment is a method of patterning a semiconductor device, the method including forming a second hard mask layer over a first hard mask layer and a semiconductor device layer, patterning the second hard mask layer to form a plurality of second hard mask portions, conformally forming a first metal-containing spacer layer over the plurality of second hard mask portions, and etching the first metal-containing spacer layer to form a first set of spacers on sidewalls of the second hard mask portions. The method further includes removing the second hard mask portions from between the first set of spacers, the first set of spacers forming a first mask pattern, patterning the first hard mask layer to form a plurality of first hard mask portions using the first mask pattern, conformally forming a second metal-containing spacer layer over the plurality of first hard mask portions, and etching the second metal-containing spacer layer to form a second set of spacers on sidewalls of the first hard mask portions. The method further includes removing the first hard mask portions from between the second set of spacers, the second set of spacers forming a second mask pattern, and patterning the semiconductor device layer to using the second mask pattern.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:

forming a first hard mask layer over a semiconductor device layer, the first hard mask layer comprising a metal-containing material;
forming a second hard mask layer over the first hard mask layer;
forming a first set of metal-containing spacers over the second hard mask layer;
patterning the second hard mask layer using the first set of metal-containing spacers as a mask;
forming a second set of metal-containing spacers on sidewalls of the patterned second hard mask layer; and
patterning the first hard mask layer using the second set of metal-containing spacers as a mask.

2. The method of claim 1, wherein the first set of metal-containing spacers and the second set of metal-containing spacers comprise titanium oxide or titanium nitride.

3. The method of claim 1, wherein the first set of metal-containing spacers over the second hard mask layer comprises:
forming a third hard mask layer over the second hard mask layer;
patterning the third hard mask layer;
forming a metal-containing spacer layer over the patterned third hard mask layer;
etching the metal-containing spacer layer to form the first set of metal-containing spacers, wherein top surfaces of the patterned third hard mask layer are exposed; and
removing the patterned third hard mask layer from between the first set of metal-containing spacers.

4. The method of claim 3, wherein the patterning the third hard mask layer comprises:
forming a photoresist on the third hard mask layer;
patterning the photoresist; and
patterning the third hard mask layer using the patterned photoresist as a mask.

5. The method of claim 4, wherein the photoresist is a tri-layer photoresists comprising a top photoresist layer, a middle layer, and a bottom layer, wherein the middle layer comprises an anti-reflective material, and wherein the bottom layer comprises a hard mask material.

6. The method of claim 3, wherein the forming the metal-containing spacer layer over the patterned third hard mask layer comprises conformally depositing the metal-containing spacer layer over the patterned third hard mask layer and the second hard mask layer.

7. The method of claim 3, further comprising forming a fourth hard mask layer on the first hard mask layer, the second hard mask layer being formed on the fourth hard mask layer.

8. The method of claim 7, wherein the first hard mask layer comprises titanium nitride, the fourth hard mask layer comprises tetraethyl orthosilicate, the second hard mask layer comprise amorphous silicon, and the third hard mask layer comprises silicon nitride.

9. The method of claim 7, wherein the first hard mask layer comprises titanium oxide, the fourth hard mask layer comprises silicon oxycarbide, the second hard mask layer comprises aluminum oxynitride, and the third hard mask layer comprises silicon oxynitride.

10. The method of claim 1, wherein the first set of metal-containing spacers have a first pitch, and wherein the second set of metal-containing spacers have a second pitch, the second pitch being about half the first pitch.

11. The method of claim 1, further comprising:
patterning the semiconductor device layer using the patterned first hard mask layer as a mask, the patterning forming a plurality of trenches in the semiconductor device layer; and
forming a plurality of conductive lines in the plurality of trenches in the semiconductor device layer.

12. A method of patterning a semiconductor device, the method comprising:
forming a first hard mask layer over a semiconductor device layer;
forming a second hard mask layer over the first hard mask layer;
forming a third hard mask layer over the second hard mask layer;
forming a fourth hard mask layer over the third hard mask layer;
patterning the fourth hard mask layer to form a plurality of fourth hard mask portions, the plurality of fourth hard mask portions having a first pitch;
forming a first plurality of metal-containing spacers on sidewalls of the plurality of fourth hard mask portions, the first plurality of metal-containing spacers having a second pitch, the second pitch being less than the first pitch;
removing the fourth hard mask portions;
patterning the third hard mask layer to form a plurality of third hard mask portions using the first plurality of metal-containing spacers as a mask, the plurality of third hard mask portions having the second pitch;
forming a second plurality of metal-containing spacers on sidewalls of the plurality of third hard mask portions, the second plurality of metal-containing spacers having a third pitch, the third pitch being less than the second pitch;
removing the third hard mask portions; and
patterning the second hard mask, the first hard mask, and the semiconductor device layer using the second plurality of metal-containing spacers as a mask.

13. The method of claim 12, wherein the first plurality of metal-containing spacers and the second plurality of metal-containing spacers comprise titanium.

14. The method of claim 12, wherein the first hard mask layer is a metal hard mask layer, and wherein the second, third, and fourth hard mask layers are dielectric hard mask layers.

15. The method of claim 12, wherein the second pitch is about half of the first pitch and wherein the third pitch is about half of the second pitch.

16. The method of claim 12, wherein the semiconductor device layer is a low-k dielectric layer.

17. The method of claim 12, further comprising:
forming a fifth hard mask layer on the third hard mask layer, the fourth hard mask layer being formed on the fifth hard mask layer, the fifth hard mask layer and the second hard mask layer having a same material composition.

18. A method of patterning a semiconductor device, the method comprising:
forming a second hard mask layer over a first hard mask layer and a semiconductor device layer;
patterning the second hard mask layer to form a plurality of second hard mask portions;
conformally forming a first metal-containing spacer layer over the plurality of second hard mask portions;
etching the first metal-containing spacer layer to form a first set of spacers on sidewalls of the second hard mask portions;
removing the second hard mask portions from between the first set of spacers, the first set of spacers forming a first mask pattern;

patterning the first hard mask layer to form a plurality of first hard mask portions using the first mask pattern;

conformally forming a second metal-containing spacer layer over the plurality of first hard mask portions;

etching the second metal-containing spacer layer to form a second set of spacers on sidewalls of the first hard mask portions;

removing the first hard mask portions from between the second set of spacers, the second set of spacers forming a second mask pattern; and patterning the semiconductor device layer to using the second mask pattern.

19. The method of claim 18, wherein the first metal-containing spacer layer and the second metal-containing layer comprise titanium oxide or titanium nitride.

20. The method of claim 18, wherein the second set of spacers have a pitch of about 32 nm.

* * * * *